US012790264B2

(12) United States Patent
An et al.

(10) Patent No.: US 12,790,264 B2

(45) Date of Patent: Nov. 10, 2026

(54) WINDOW, DISPLAY DEVICE INCLUDING THE WINDOW, AND METHOD OF MANUFACTURING THE WINDOW

(71) Applicant: Samsung Display Co., Ltd., Yongin-si (KR)

(72) Inventors: Taeho An, Yongin-si (KR); Won-Jong Baek, Yongin-si (KR); Myunghun Baek, Yongin-si (KR); Jeong Seok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 228 days.

(21) Appl. No.: 18/406,822

(22) Filed: Jan. 8, 2024

(65) Prior Publication Data

US 2024/0343640 A1 Oct. 17, 2024

(30) Foreign Application Priority Data

Apr. 14, 2023 (KR) ........................ 10-2023-0049220

(51) Int. Cl.

*H05K 5/03* (2006.01)
*C03C 21/00* (2006.01)

(52) U.S. Cl.

CPC ............. *C03C 21/002* (2013.01); *H05K 5/03* (2013.01)

(58) Field of Classification Search

CPC ........ C03C 21/002; C03C 3/097; H05K 5/03; G06F 1/1637; H10K 59/872; G09F 9/30; Y02W 30/62

See application file for complete search history.

(56) References Cited

U.S. PATENT DOCUMENTS

| | | | | |
|---|---|---|---|---|
| 9,701,569 | B2 | 7/2017 | Demartino et al. | |
| 9,977,470 | B2 | 5/2018 | Demartino et al. | |
| 10,017,417 | B2 | 7/2018 | Dejneka et al. | |
| 10,730,791 | B2 | 8/2020 | Hu et al. | |
| 11,198,642 | B2 | 12/2021 | Kashima et al. | |
| 11,639,308 | B2 | 5/2023 | Imakita et al. | |
| 2017/0355640 | A1* | 12/2017 | Oram | C03C 4/18 |
| 2022/0242780 | A1* | 8/2022 | Hunt | C03C 21/002 |

FOREIGN PATENT DOCUMENTS

| | | |
|---|---|---|
| CN | 114133147 | 3/2022 |
| CN | 115159841 | 10/2022 |
| JP | 2019-123658 | 7/2019 |
| JP | 2022-159558 | 10/2022 |

* cited by examiner

*Primary Examiner* — Nathan L Van Sell

(74) *Attorney, Agent, or Firm* — Sughrue Mion, PLLC

(57) ABSTRACT

A window includes a tempered glass substrate that includes a base layer and a compressive stress layer including a first region and a second region. The second region includes a first portion that includes a first point and is adjacent to the first region, a second portion that includes a second point and is adjacent to the base layer, and a third portion that includes a third point and that is disposed between the first portion and the second portion. A compressive stress at the first point is in a range of about 100 MPa to about 250 MPa, a compressive stress at the second point is in a range of about 50 MPa to about 150 MPa, and a compressive stress at the third point is in a range of about 70 MPa to about 200 MPa.

9 Claims, 12 Drawing Sheets

WINDOW, DISPLAY DEVICE INCLUDING THE WINDOW, AND METHOD OF MANUFACTURING THE WINDOW

CROSS-REFERENCE TO RELATED APPLICATIONS

This application claims priority to and benefits of Korean Patent Application No. 10-2023-0049220 under 35 U.S.C. § 119 filed on Apr. 14, 2023, in the Korean Intellectual Property Office (KIPO), the entire contents of which are incorporated herein by reference.

BACKGROUND

Embodiments of the disclosure described herein relate to a window including a tempered glass substrate subjected to chemical strengthening, a display device including the window, and a window manufacturing method including a step of making the glass substrate subject to chemical strengthening.

Display devices are used in various multimedia devices, such as televisions, mobile phones, tablet computers, game machines, and the like, to provide image information to users. Each of the display devices may include a display module and a window.

The window included in the display device effectively transfers image information provided from the display module to the outside and protects the display module from the outside. Studies are being conducted to enhance the impact resistance of a glass substrate used in a window. For example, heat treatment, chemical processing, or the like may be performed to improve the strength of a glass substrate.

SUMMARY

Embodiments of the disclosure provide a window having improved strength and a window manufacturing method.

Embodiments of the disclosure provide a display device including a window having improved strength.

According to an embodiment, a window includes a tempered glass substrate containing a $Li^+$ ion, a $Na^+$ ion, and a $K^+$ ion. The tempered glass substrate includes a base layer and a compressive stress layer disposed on at least one of an upper surface and a lower surface of the base layer. The compressive stress layer includes a first region having a first compressive stress change rate and a second region having a second compressive stress change rate smaller than the first compressive stress change rate. Each of the first compressive stress change rate and the second compressive stress change rate is defined as a rate of change of compressive stress depending on a depth based on a thickness direction of the tempered glass substrate. The second region includes a first portion that includes a first point and is adjacent to the first region, a second portion that includes a second point and is adjacent to the base layer, and a third portion that includes a third point and that is disposed between the first portion and the second portion. A compressive stress at the first point is in a range of about 100 MPa to about 250 MPa, a compressive stress at the second point is in a range of about 50 MPa to about 150 MPa, and a compressive stress at the third point is in a range of about 70 MPa to about 200 MPa. The compressive stresses are measured in ASTM standard C770-16.

The first point may be located at a depth of about 30 μm from a surface of the tempered glass substrate based on the thickness direction. The second point may be located at a depth of about 70 μm from the surface of the tempered glass substrate based on the thickness direction. The third point may be located at a depth of about 50 μm from the surface of the tempered glass substrate based on the thickness direction.

The compressive stress layer may have a thickness in a range of about 100 μm to about 130 μm.

A compressive stress on a surface of the tempered glass substrate may be in a range of about 750 MPa to about 1300 MPa.

A value obtained by integrating compressive stress depending on a depth of the compressive stress layer may be in a range of about 10,000 $J/m^2$ to about 14,000 $J/m^2$.

The first region may be spaced apart from the base layer with the second region being disposed between the first region and the base layer.

The tempered glass substrate may have a thickness in a range of about 400 μm to about 800 μm.

According to an embodiment, a display device includes a display module and a window that is disposed on the display module and that includes a base layer and a compressive stress layer disposed on at least one of an upper surface and a lower surface of the base layer. The compressive stress layer includes a first region having a first compressive stress change rate and a second region having a second compressive stress change rate smaller than the first compressive stress change rate. Each of the first compressive stress change rate and the second compressive stress change rate is defined as a rate of change of compressive stress depending on a depth based on a thickness direction of the window. The second region includes a first portion that includes a first point and is adjacent to the first region, a second portion that includes a second point and is adjacent to the base layer, and a third portion that is disposed between the first portion and the second portion and that includes a third point. A compressive stress at the first point is in a range of about 100 MPa to about 250 MPa, a compressive stress at the second point is in a range of about 50 MPa to about 150 MPa, and a compressive stress at the third point is in a range of about 70 MPa to about 200 MPa. The compressive stresses are measured in ASTM standard C770-16.

The first point may be located at a depth of about 30 μm from a surface of the window based on the thickness direction. The second point may be located at a depth of about 70 μm from the surface of the window based on the thickness direction. The third point may be located at a depth of about 50 μm from the surface of the window based on the thickness direction.

A compressive stress on a surface of the window may be in a range of about 750 MPa to about 1300 MPa, and a value obtained by integrating compressive stress depending on a depth of the compressive stress layer may be in a range of about 10,000 $J/m^2$ to about 14,000 $J/m^2$.

The window may have a thickness in a range of about 400 μm to about 800 μm, and the compressive stress layer may have a thickness in a range of about 100 μm to about 130 μm.

According to an embodiment, a window manufacturing method includes preparing a first preliminary glass substrate containing a $Li^+$ ion and a $Na^+$ ion, forming a second preliminary glass substrate by providing a first strengthening molten salt containing a $Na^+$ ion to the first preliminary glass substrate, forming a third preliminary glass substrate by providing a second strengthening molten salt containing a $Na^+$ ion and a $K^+$ ion to the second preliminary glass substrate, and forming a tempered glass substrate by providing a third strengthening molten salt containing a $K^+$ ion to the third preliminary glass substrate.

The first strengthening molten salt may contain $NaNO_3$ and may not contain a $K^+$ ion.

The second strengthening molten salt may contain $NaNO_3$ and $KNO_3$. Based on the total weight of the second strengthening molten salt, $NaNO_3$ may be in a range of about 30 wt % to about 70 wt %, and $KNO_3$ may be in a range of about 30 wt % to about 70 wt %.

The third strengthening molten salt may contain $KNO_3$ and may not contain a $Na^+$ ion.

The third preliminary glass substrate may include a compressive stress layer, and the compressive stress layer of the third preliminary glass substrate may have a thickness in a range of about 90 μm to about 120 μm.

A slope of compressive stress depending on a depth based on a thickness direction of the third preliminary glass substrate may be greater than about −10 MPa/μm and less than about 0 MPa/μm, and the compressive stress may be measured in ASTM standard C770-16.

A compressive stress at a depth of about 30 μm from a surface of the third preliminary glass substrate based on a thickness direction of the third preliminary glass substrate may be in a range of about 180 MPa to about 300 MPa. A compressive stress at a depth of about 50 μm from the surface of the third preliminary glass substrate based on the thickness direction may be in a range of about 100 MPa to about 200 MPa. The compressive stresses may be measured in ASTM standard C770-16.

A compressive stress at a depth of about 30 μm from a surface of the tempered glass substrate based on a thickness direction of the tempered glass substrate may be in a range of about 100 MPa to about 250 MPa. A compressive stress at a depth of about 50 μm from the surface of the tempered glass substrate based on the thickness direction may be in a range of about 70 MPa to about 200 MPa. A compressive stress at a depth of about 70 μm from the surface of the tempered glass substrate based on the thickness direction may be in a range of about 50 MPa to about 150 MPa. The compressive stresses may be measured in ASTM standard C770-16.

The tempered glass substrate may include a compressive stress layer, and the compressive stress layer of the tempered glass substrate may have a thickness in a range of about 100 μm to about 130 μm.

The tempered glass substrate may include a compressive stress layer. A compressive stress on a surface of the tempered glass substrate may be in a range of about 750 MPa to about 1300 MPa. The compressive stress may be measured in ASTM standard C770-16.

The tempered glass substrate may include a compressive stress layer, and a value obtained by integrating compressive stress depending on a depth of the compressive stress layer may be in a range of about 10,000 $J/m^2$ to about 14,000 $J/m^2$.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1:
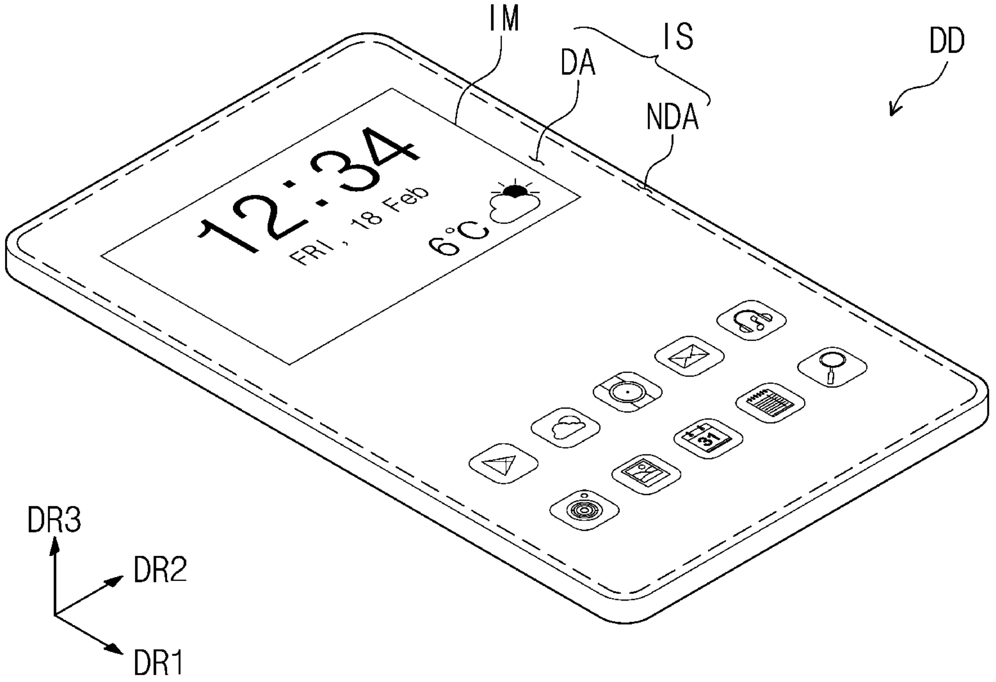
FIG. 1 is a schematic perspective view of a display device according to an embodiment of the disclosure.

Various changes can be made to the disclosure, and various embodiments of the disclosure may be implemented. Thus, specific embodiments are illustrated in the drawings and described as examples herein. However, it should be understood that the disclosure is not to be construed as being limited thereto and covers all modifications, equivalents, and alternatives falling within the spirit and scope of the disclosure.

In this specification, when it is mentioned that a component (or an area, a layer, a part, etc.) is referred to as being "on", "connected to" or "coupled to" another component, this means that the component may be directly on, connected to, or coupled to the other component or that a third component may be present therebetween.

The expression "directly disposed" used herein may mean that there is no additional layer, film, area, or plate between one portion, such as a layer, a film, an area, or a plate, and another portion. For example, the expression "directly disposed" may mean that two layers or two members are disposed without an additional member such as an adhesive member therebetween.

Identical reference numerals refer to identical components. Additionally, in the drawings, the thicknesses, proportions, and dimensions of components are exaggerated for effective description.

As used herein, the term "and/or" includes all of one or more combinations defined by related components. For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Terms such as first, second, and the like may be used to describe various components, but the components should not be limited by the terms. The terms may be used only for distinguishing one component from other components. For example, without departing the scope of the disclosure, a first component may be referred to as a second component, and similarly, the second component may also be referred to as the first component. The terms of a singular form may include plural forms or meanings unless otherwise specified.

In addition, terms such as "below", "under", "above", and "over" are used to describe a relationship of components illustrated in the drawings. The terms are relative concepts and are described based on directions illustrated in the drawing. The expression "disposed on" used herein may mean that it is disposed not only on an upper portion but also a lower portion of any one member.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

Hereinafter, a window, a display device, and a window manufacturing method according to embodiments of the disclosure will be described with reference to the accompanying drawings.

FIG. 1 is a schematic perspective view of the display device DD according to an embodiment of the disclosure.

The display device DD may be a device that may be activated by an electrical signal. The display device DD may be a flexible device. For example, the display device DD may be a portable electronic device, a tablet computer, a car navigation device, a game console, a personal computer, a laptop computer, or a wearable device. However, embodiments are not limited thereto. FIG. 1 illustrates an example that the display device DD is a portable electronic device.

Although FIG. 1 and the following drawings illustrate a first direction DR1, a second direction DR2, and a third direction DR3, the directions indicated by the first direction DR1, the second direction DR2, and the third direction DR3 described in this specification may be relative concepts and may be changed to different directions. In this specification, the first direction DR1 and the second direction DR2 may be orthogonal to each other, and the third direction DR3 may be a normal direction to a plane defined by the first direction DR1 and the second direction DR2.

In this specification, a thickness direction of the display device DD may be a direction parallel to the third direction DR3 that is the normal direction to the plane defined by the first direction DR1 and the second direction DR2. Front surfaces (or upper surfaces) and rear surfaces (or lower surfaces) of members constituting the display device DD may be defined based on the third direction DR3.

The display device DD may display an image IM on or through a display surface IS. The display surface IS may include a display region DA and a non-display region NDA adjacent to the display region DA. The non-display region NDA may be a region on which an image is not displayed. However, embodiments are not limited thereto, and the non-display region NDA may be omitted. The display surface IS may include a surface on a plane defined by the first direction DR1 and the second direction DR2.

Figure 2:
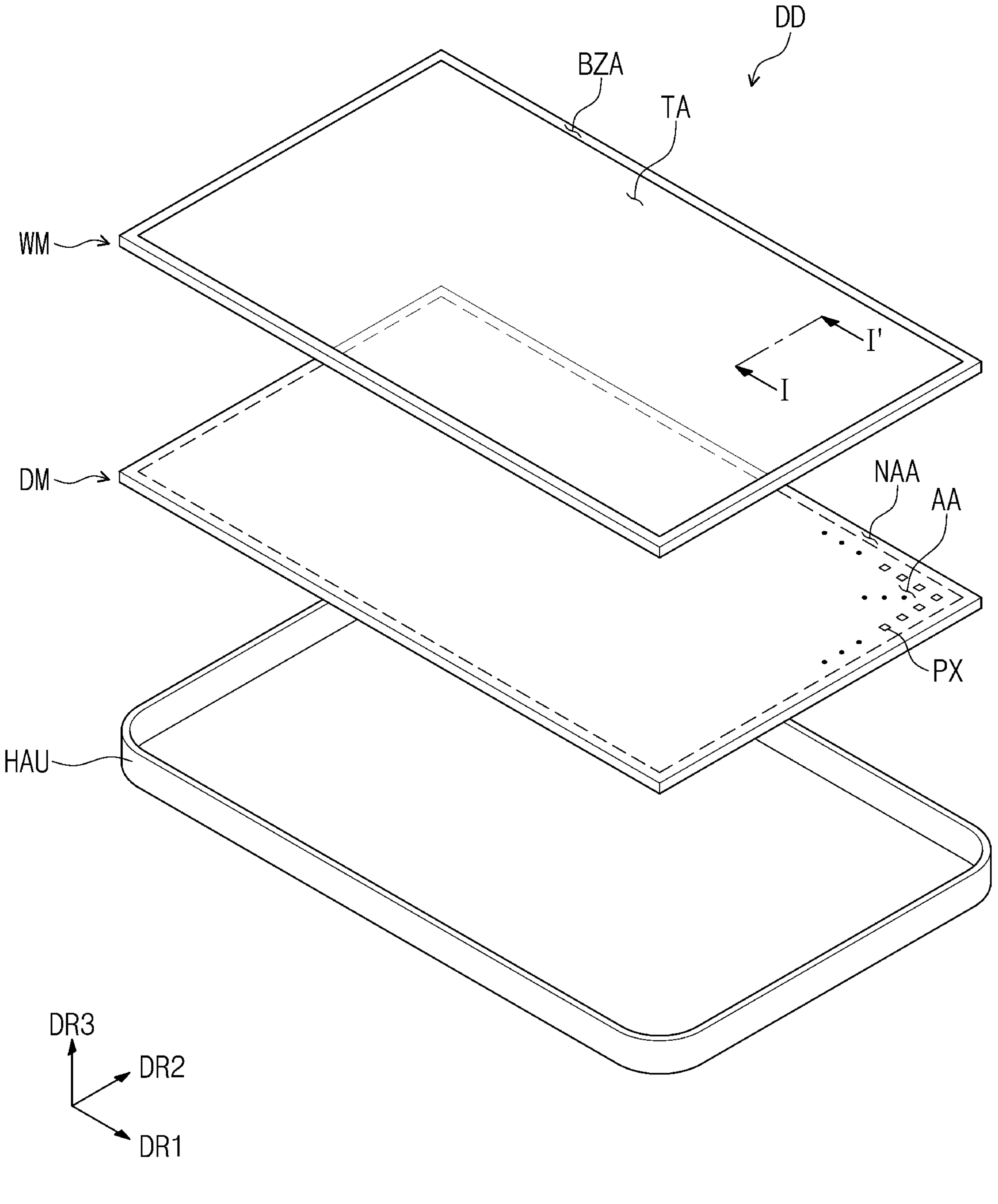
FIG. 2 is a schematic exploded perspective view of the display device according to an embodiment of the disclosure.

FIG. 2 is a schematic exploded perspective view of the display device DD according to an embodiment of the disclosure.

The display device DD may include a display module DM and a window WM disposed on at least one of an upper portion and a lower portion of the display module DM. Although FIG. 2 illustrates an example that the window WM is disposed on the upper portion of the display module DM, this is illustrative, and the window WM may be disposed on the upper portion and the lower portion of the display module DM.

The display device DD may further include a housing HAU in which the display module DM is accommodated. In the display device DD illustrated in FIGS. 1 and 2, the window WM and the housing HAU may be coupled with each other to form an exterior of the display device DD. The housing HAU may be disposed under the display module DM. The housing HAU may include a material having a relatively high rigidity. For example, the housing HAU may include frames and/or plates formed of glass, plastic, and/or metal. The housing HAU may provide a receiving space. The display module DM may be accommodated in the receiving space and may be protected from external impact.

The display module DM may be activated by an electrical signal. The display module DM may be activated to display the image IM (refer to FIG. 1) on the display surface IS (refer to FIG. 1) of the display device DD. The display module DM may be activated to sense an external input applied to an upper surface thereof. The external input may include a touch of a user, contact or proximity of an object (e.g., tangible or intangible object), pressure, light, or heat, and is not limited to any one embodiment.

The display module DM may include an active region AA and a peripheral region NAA. The active region AA may be a region that provides the image IM (refer to FIG. 1). Pixels PX may be disposed in the active region AA. The peripheral region NAA may be adjacent to the active region AA. The peripheral region NAA may surround the active region AA. A drive circuit or a drive line for driving the active region AA may be disposed in the peripheral region NAA.

The display module DM may include the pixels PX. Each of the pixels PX may emit light in response to an electrical signal. The light beams emitted by the pixels PX may implement or express the image IM (refer to FIG. 1). Each of the pixels PX may include a display element. For example, the display element may be an organic light emitting element, an inorganic light emitting element, an organic-inorganic light emitting element, a micro-LED, a nano-LED, a quantum-dot light emitting element, an electrophoretic element, and/or an electrowetting element.

The window WM may include a transmissive region TA and a bezel region BZA. The transmissive region TA may overlap at least a portion of the active region AA of the display module DM. The transmissive region TA may be an optically transparent region. For example, the transmissive region TA may have a visible light transmittance of about 90% or more. The image IM (refer to FIG. 1) may be provided to the user through the transmissive region TA, and the user may receive information through the image IM (refer to FIG. 1).

The bezel region BZA may be a region having a lower light transmittance than the transmissive region TA. The bezel region BZA may define the shape of the transmissive region TA. The bezel region BZA may be adjacent to the transmissive region TA and may surround the transmissive region TA.

The bezel region BZA may have a color (e.g., a predetermined or selectable color). The bezel region BZA may cover or overlap the peripheral region NAA of the display module DM to interrupt visibility of the peripheral region NAA from the outside. However, this is illustrative, and in the window WM according to an embodiment, the bezel region BZA may be omitted.

Figure 3:
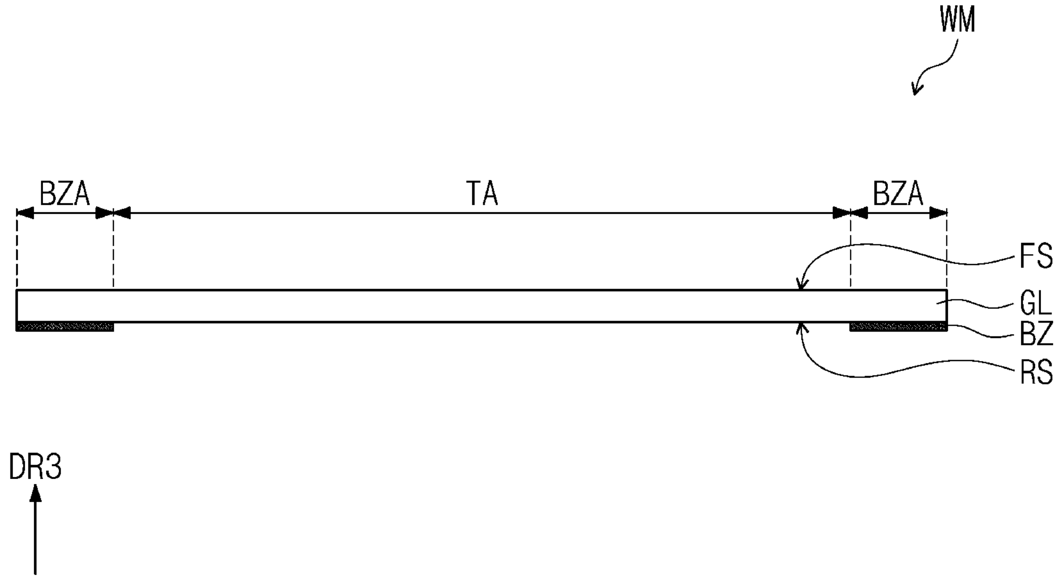
FIG. 3 is a schematic sectional view of a window according to an embodiment of the disclosure.

FIG. 3 is a schematic sectional view of the window module WM according to an embodiment of the disclosure.

The window WM may include a tempered glass substrate GL, and the tempered glass substrate GL may contain $Li^+$ ions, $Na^+$ ions, and $K^+$ ions. The tempered glass substrate GL may be a glass substrate subjected to chemical strengthening through a window manufacturing method that will be described below.

The window WM may include the tempered glass substrate GL in which at least some of $Li^+$ ions contained in a preliminary glass substrate are replaced with $Na^+$ ions and at least some of $Na^+$ ions contained in the preliminary glass substrate are replaced with $K^+$ ions. In this specification, the preliminary glass substrate may refer to a glass substrate in a state in which a chemical strengthening process is not completed.

The tempered glass substrate GL containing $Li^+$ ions, $Na^+$ ions, and/or $K^+$ ions may exhibit an improved compressive stress. A compressive stress layer CSL (refer to FIG. 4) formed through ion exchange may be formed deep in the tempered glass substrate GL, and thus not only the compressive stress on the surface of the tempered glass substrate GL but also the internal compressive stress may be improved.

Accordingly, the window WM including the tempered glass substrate GL may exhibit excellent strength. The window WM including the tempered glass substrate GL according to the embodiment of the disclosure may exhibit an excellent or desirable strength with which the window WM may not be damaged even in case that the window WM is dropped from a high place.

Referring to FIG. 3, the tempered glass substrate GL may include an upper surface FS and a lower surface RS facing away from the upper surface FS. The upper surface FS of the tempered glass substrate GL may be exposed outside the display device DD and may define an upper surface of the window WM and an upper surface of the display device DD.

The window WM may further include a printed layer BZ disposed on the lower surface RS of the tempered glass substrate GL. The printed layer BZ may be formed on the lower surface RS of the tempered glass substrate GL through a printing or deposition process. The printed layer BZ may be directly disposed on the lower surface RS of the tempered glass substrate GL.

The printed layer BZ may be disposed on the lower surface RS of the tempered glass substrate RS to define the bezel region BZA. The printed layer BZ may have a relatively low light transmittance when compared to the tempered glass substrate GL. For example, the printed layer BZ may have a color (e.g., a predetermined or selectable color). Accordingly, the printed layer BZ may selectively transmit/reflect only light having a specific wavelength or color. As another example, the printed layer BZ may be a light blocking layer that absorbs incident light. The printed layer BZ may have various light transmittances and colors depending on the type of the display device DD and the shape of the display device DD.

Figure 4:
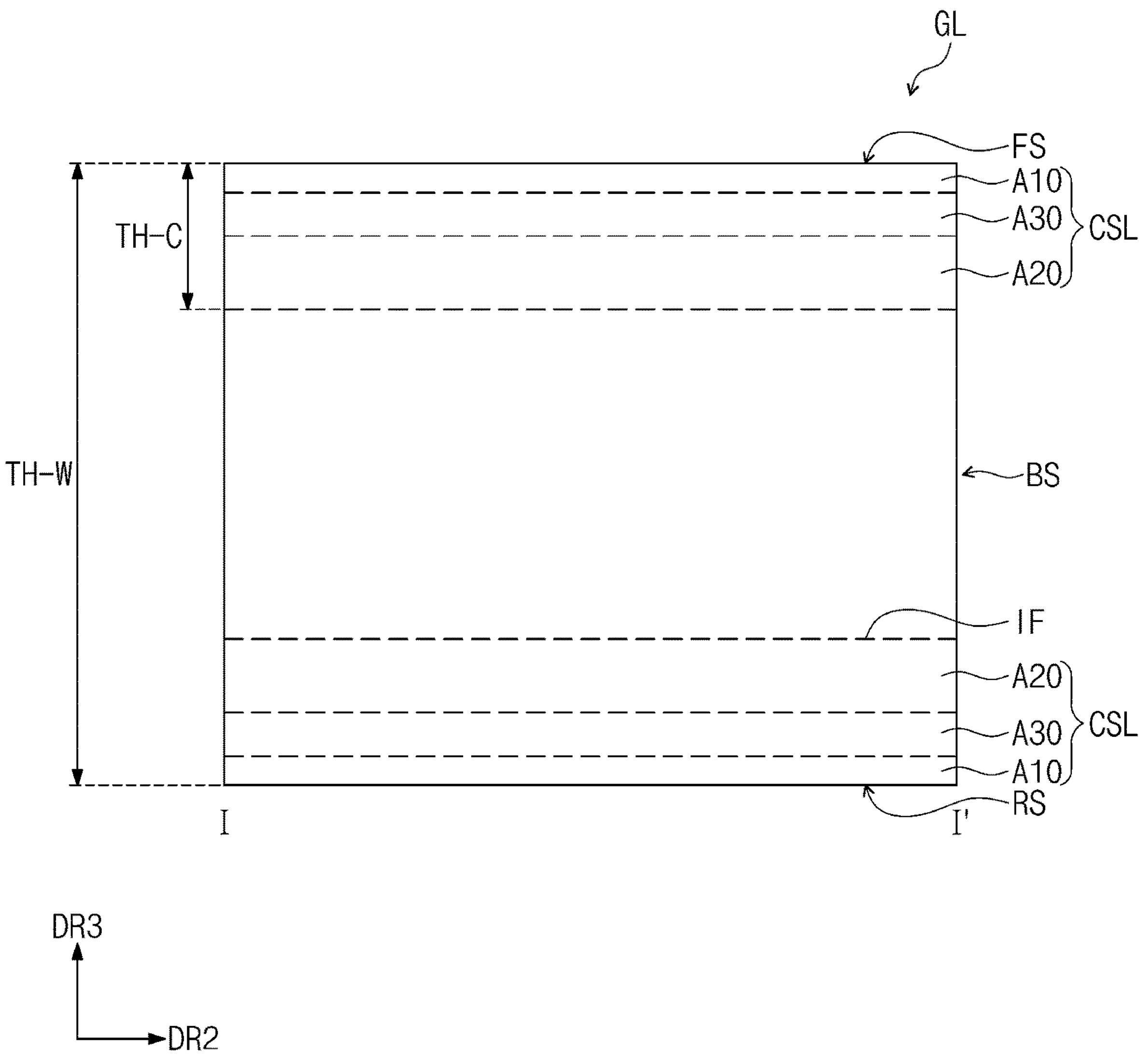
FIG. 4 is a schematic sectional view of a tempered glass substrate according to an embodiment of the disclosure.

FIG. 4 is a schematic sectional view of the tempered glass substrate GL according to an embodiment of the disclosure.

FIG. 4 illustrates a section of a portion corresponding to line I-I' of FIG. 2. FIG. 4 more specifically illustrates the tempered glass substrate GL in the window WM (refer to FIG. 2) according to an embodiment.

The window WM may include the tempered glass substrate GL containing $Li^+$ ions, $Na^+$ ions, and/or $K^+$ ions. The tempered glass substrate GL may be glass including an alumino-silicate skeleton formed from $Al_2O_3$ and $SiO_2$. The tempered glass substrate GL may be formed by strengthening lithium alumino-silicate (LAS) glass containing $Li^+$ ions in an alumino-silicate skeleton. As another example, the tempered glass substrate GL may be formed by strengthening ceramic glass containing $Li^+$ ions. The tempered glass substrate GL may be ultra-thin glass UTG™.

The tempered glass substrate GL may include the compressive stress layer CSL having different compressive stresses depending on the depth. The window WM may be formed by a method of manufacturing the window WM according to an embodiment that will be described below. In an embodiment, the concentrations of $Li^+$ ions, $Na^+$ ions, and $K^+$ ions contained in the tempered glass substrate GL may differ from one another depending on the depth of the tempered glass substrate GL.

The tempered glass substrate GL according to an embodiment may include a base layer BS and the compressive stress layer CSL. The compressive stress layer CSL may be disposed on at least one of an upper surface and a lower surface of the base layer BS. FIG. 4 illustrates an example that the compressive stress layer CSL is disposed on the upper surface and the lower surface of the base layer BS. However, this is illustrative, and the compressive stress layer CSL may be disposed on only one of the upper surface of the base layer BS and the lower surface of the base layer BS. The upper surface of the base layer BS and the lower surface of the base layer BS may face each other based on the third direction DR3.

The base layer BS and the compressive stress layer CSL may contact each other. A compressive stress of the base layer BS may be zero. The compressive stress layer CSL may be defined as a layer having a compressive stress exceeding zero. A compressive stress may be zero at an interface IF where the base layer BS and the compressive stress layer CSL contact each other.

The total thickness TH-W of the tempered glass substrate GL may be in a range of about 400 μm to about 800 μm. Based on about 100% of the total thickness TH-W of the tempered glass substrate GL, the thickness TH-C of the compressive stress layer CSL may be in a range of about 12.5% to about 32.5%. The thickness TH-C of the compressive stress layer CSL may be in a range of about 100 μm to about 130 μm.

The window WM including the compressive stress layer CSL having the thickness TH-C of about 12.5% to about 32.5% based on about 100% of the total thickness TH-W of the tempered glass substrate GL may exhibit an excellent or desirable strength. In contrast, a window including a compressive stress layer CSL having a thickness of less than about 12.5% based on about 100% of the total thickness TH-W of the tempered glass substrate GL may exhibit a low strength and may be vulnerable to an external impact. A window WM including a compressive stress layer CSL having a thickness TH-C exceeding about 32.5% based on about 100% of the total thickness TH-W of a tempered glass substrate GL may be difficult to implement in a process.

The compressive stress layer CSL may include a first region A10 having a first compressive stress change rate and a second region A20 having a second compressive stress change rate. The compressive stress layer CSL may further include an inflection region A30 between the first region A10 and the second region A20, and the first compressive stress change rate may be changed to the second compressive stress change rate through the inflection region A30. The first compressive stress change rate may be greater than the second compressive stress change rate. Each of the first compressive stress change rate and the second compressive stress change rate may be defined as a rate of change of a compressive stress depending on the depth based on the thickness direction of the tempered glass substrate GL.

In this specification, a compressive stress change rate may be defined as a rate of change of a compressive stress depending on the depth based on the thickness direction, e.g., the third direction DR3. For example, in a graph in which the horizontal axis represents depth and the vertical axis represents the compressive stress, a compressive stress change rate may be defined as an absolute value of a slope. Specifically, in a graph in which the horizontal axis represents depth and the vertical axis represents compressive stress, a compressive stress variation depending on a depth variation may be defined as a compressive stress change rate. A point having a value of 0 on the horizontal axis may correspond to the upper surface FS or the lower surface RS of the tempered glass substrate GL. For example, the point having a value of 0 on the horizontal axis may correspond to a surface of the tempered glass substrate GL.

The first region A10 may be a region disposed on the upper surface FS of the tempered glass substrate GL and/or the lower surface RS of the tempered glass substrate GL. For example, the first region A10 may be a region exposed on or to the surface of the tempered glass substrate GL.

The second region A20 may be a region adjacent to the base layer BS. A separate region may not be defined between the second region A20 and the base layer BS, and a surface of the second region A20 and a surface of the base layer BS may contact each other.

The second region A20 may include a first portion adjacent to the first region A10, a second portion adjacent to the base layer BS, and a third portion disposed between the first portion and the second portion. Specifically, the first portion of the second region A20 may be a portion adjacent to the inflection region A30. For example, the first portion may include a portion corresponding to a depth of about 20 μm to about 40 μm from the surface of the tempered glass substrate GL. Furthermore, for example, the second portion may include a portion corresponding to a depth of about 60 μm to about 80 μm from the surface of the tempered glass substrate GL. In addition, for example, the third portion may include a portion corresponding to a depth of about 40 μm to about 60 μm from the surface of the tempered glass substrate GL.

A compressive stress of the first portion may be greater than compressive stresses of the second portion and the third portion, and the compressive stress of the third portion may be greater than the compressive stress of the second portion. The first portion may include a first point, the second portion may include a second point, and the third portion may include a third point. For example, the first point may be located at a depth of about 30 μm from the surface of the tempered glass substrate GL, the second point may be located at a depth of about 70 μm from the surface of the tempered glass substrate GL, and the third point may be located at a depth of about 50 μm from the surface of the tempered glass substrate GL.

The inflection region A30 may be a region between the first region A10 and the second region A20. The first region A10 may be spaced apart from the base layer BS with the second region A20 and the inflection region A30 therebetween. The inflection region A30 may be spaced apart from the base layer BS with the second region A20 therebetween. For example, the inflection region A30 may include a portion corresponding to a depth of about 3 μm to about 10 μm from the surface of the tempered glass substrate GL.

Figure 5:
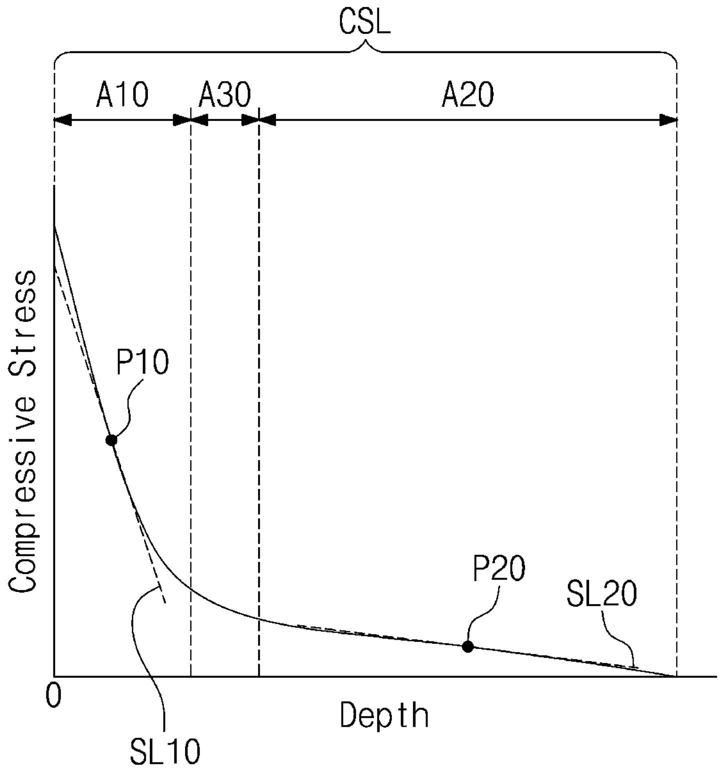
FIG. 5 is a graph depicting the compressive stress depending on the depth of the tempered glass substrate according to an embodiment of the disclosure.

FIG. 5 is a schematic graph depicting the compressive stress depending on the depth of the tempered glass substrate GL (refer to FIG. 4) according to an embodiment of the disclosure.

In FIG. 5, the vertical axis represents the compressive stress, and the horizontal axis represents depth based on the thickness direction. The point at a depth of zero corresponds to the upper surface FS (refer to FIG. 4) or the lower surface RS (refer to FIG. 4) of the tempered glass substrate GL (refer to FIG. 4).

In FIG. 5, the compressive stress depending on the depth of the compressive stress layer CSL of the tempered glass substrate GL (refer to FIG. 4) is illustrated. In FIG. 5, the depth may increase in the order of the first region A10, the inflection region A30, and the second region A20, and a compressive stress value may decrease in the order of the first region A10, the inflection region A30, and the second region A20. For example, the compressive stress in the first region A10 may be greater than the compressive stress in the second region A20 and the compressive stress in the inflection region A30. The compressive stress in the second region A20 may be smaller than the compressive stress in the first region A10 and the compressive stress in the inflection region A30. In FIG. 5, a region deeper than the second region A20 may be a region corresponding to the base layer BS (refer to FIG. 4).

In the graph of compressive stress versus depth, the first region A10 may have a first slope SL10. The first slope SL10 may correspond to the first compressive stress change rate of the first region A10. The first slope SL10 may represent an instantaneous rate of change at a point P10 in the first region A10 illustrated in FIG. 5. For example, the first slope SL10 may be the slope of a tangent line at the point P10 in the first region A10 illustrated in FIG. 5. The absolute value of the first slope SL10 in the first region A10 may be greater than the absolute value of a second slope SL20 in the second region A20. The instantaneous rate of change at each point P10 in the entire area of the first region A10 may be greater than the instantaneous rate of change at each point P20 in the entire area of the second region A20. The average rate of change in the entire area of the first region A10 may be greater than the average rate of change in the entire area of the second region A20.

In the graph of compressive stress versus depth, the second region A20 may have the second slope SL20. The second slope SL20 may correspond to the second compressive stress change rate of the second region A20. The second slope SL20 may represent an instantaneous rate of change at a point P20 in the second region A20 illustrated in FIG. 5. For example, the second slope SL20 may be the slope of a tangent line at the point P20 in the second region A20 illustrated in FIG. 5.

The first compressive stress change rate may be five or more times greater than the second compressive stress change rate. For example, the first slope SL10 illustrated in FIG. 5 may be about five or more times greater than the second slope SL20. The first slope SL10 may be about ten or more times greater than the second slope SL20, or may be about 20 or more times greater than the second slope SL20.

The compressive stress change rate in the inflection region A30 may be changed from the first compressive stress change rate to the second compressive stress change rate.

In this specification, the compressive stress may represent a value measured in ASTM standard C770-16. The surface of the tempered glass substrate GL (refer to FIG. 4) may represent at least one of the upper surface FS (refer to FIG. 4) or the lower surface RS (refer to FIG. 4). In FIG. 5, the surface of the tempered glass substrate GL (refer to FIG. 4) may mean a point where the depth is zero.

A compressive stress on the surface of the tempered glass substrate GL (refer to FIG. 4) may be in a range of about 750 MPa to about 1300 MPa. As the compressive stress on the surface of the tempered glass substrate GL (refer to FIG. 4) has the aforementioned range, the tempered glass substrate GL (refer to FIG. 4) including the compressive stress layer CSL may exhibit an excellent or desirable strength.

In the second region A20 of the tempered glass substrate GL (refer to FIG. 4), a compressive stress at the first point described above with reference to FIG. 4 may be in a range of about 100 MPa to about 250 MPa, a compressive stress at the second point described above with reference to FIG. 4 may be in a range of about 50 MPa to about 150 MPa, and a compressive stress at the third point described above with reference to FIG. 4 may be in a range of about 70 MPa to about 200 MPa.

For example, the first point may be located at a depth of about 30 μm from the surface of the tempered glass substrate GL, the second point may be located at a depth of about 70 μm from the surface of the tempered glass substrate GL, and the third point may be located at a depth of about 50 μm from the surface of the tempered glass substrate GL.

For example, a depth of about 30 μm, a depth of about 50 μm, and a depth of about 70 μm from the surface of the tempered glass substrate GL (refer to FIG. 4) based on the thickness direction may be included in the second region A20. A compressive stress at the depth of about 30 μm from the surface of the tempered glass substrate GL (refer to FIG. 4) based on the thickness direction may be in a range of about 100 MPa to about 250 MPa. A compressive stress at the depth of about 50 μm from the surface of the tempered glass substrate GL (refer to FIG. 4) based on the thickness direction may be in a range of about 70 MPa to about 200 MPa. A compressive stress at the depth of about 70 μm from the surface of the tempered glass substrate GL (refer to FIG. 4) based on the thickness direction may be in a range of about 50 MPa to about 150 MPa.

As the compressive stress in the compressive stress layer CSL of the tempered glass substrate GL (refer to FIG. 4) has the aforementioned range, not only the surface but also the inside of the tempered glass substrate GL (refer to FIG. 4) including the compressive stress layer CSL may exhibit an excellent or desirable strength. In particular, impact resistance, e.g., when the tempered glass substrate GL (refer to FIG. 4) is dropped from a high place may be improved.

A value obtained by integrating the compressive stress depending on the depth of the compressive stress layer CSL of the tempered glass substrate GL (refer to FIG. 4) may be in a range of about 10,000 J/$m^2$ to about 14,000 J/$m^2$. For example, the area under a graph in which the horizontal axis represents the depth of the compressive stress layer CSL and the vertical axis represents compressive stress may be in a range of about 10,000 J/$m^2$ to about 14,000 J/$m^2$.

As the value obtained by integrating the compressive stress depending on the depth in the compressive stress layer CSL of the tempered glass substrate GL (refer to FIG. 4) has the aforementioned range, not only the surface but also the inside of the tempered glass substrate GL (refer to FIG. 4) including the compressive stress layer CSL may exhibit excellent strength. In particular, impact resistance when the tempered glass substrate GL (refer to FIG. 4) is dropped from a high place may be improved.

The window WM (refer to FIG. 2) including the above-described tempered glass substrate GL (refer to FIG. 4) including the compressive stress layer CSL may exhibit an excellent or desirable strength, and the display device DD (refer to FIG. 2) including the window WM (refer to FIG. 2) may exhibit excellent reliability against external impact.

Figure 6:
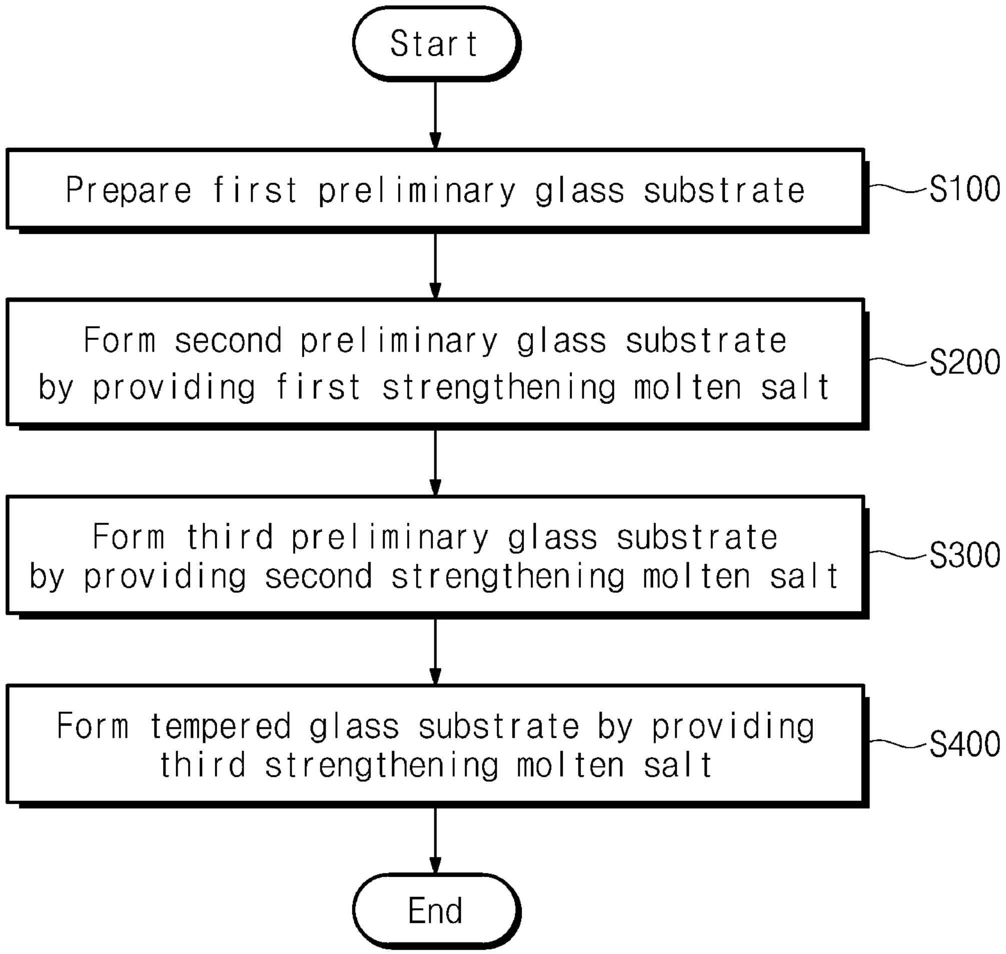
FIG. 6 is a schematic flowchart illustrating a window manufacturing method according to an embodiment of the disclosure.
Figure 7A:
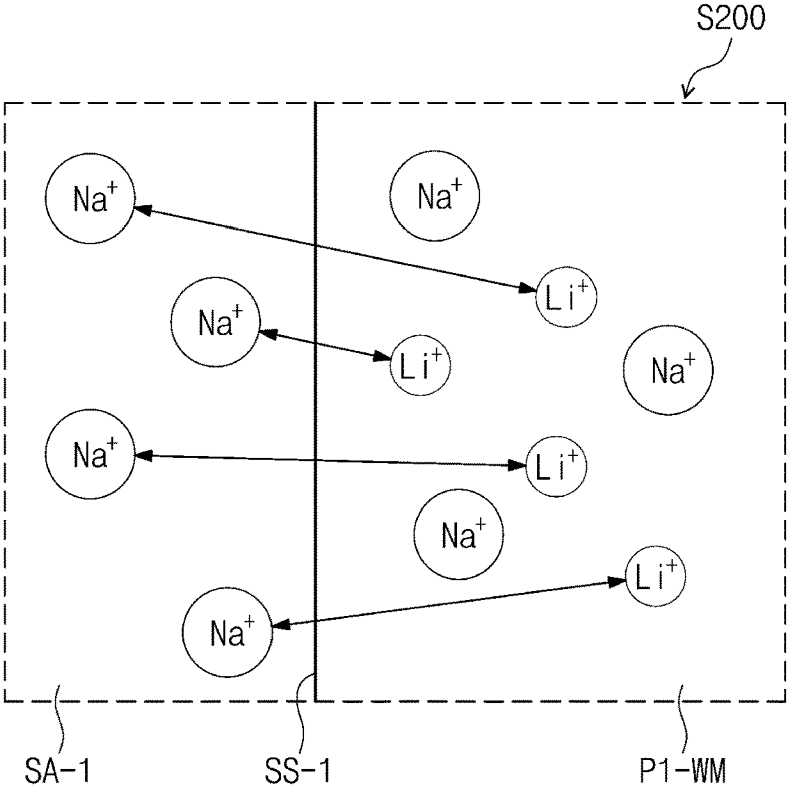
FIG. 7A is a schematic view illustrating a step of the window manufacturing method according to an embodiment of the disclosure.
Figure 7B:
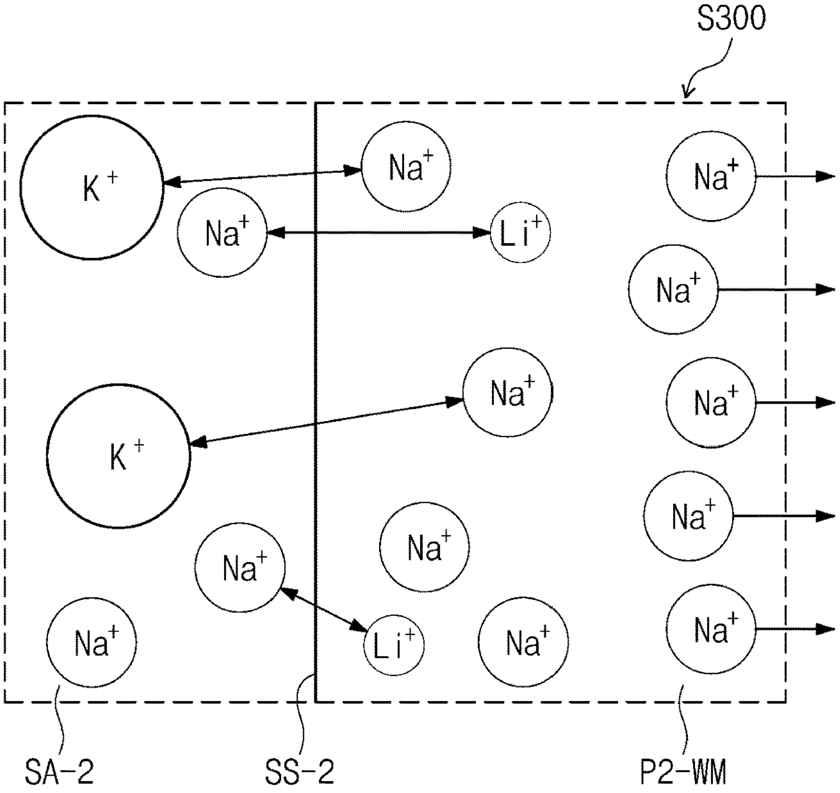
FIG. 7B is a schematic view illustrating a step of the window manufacturing method according to an embodiment of the disclosure.
Figure 7C:
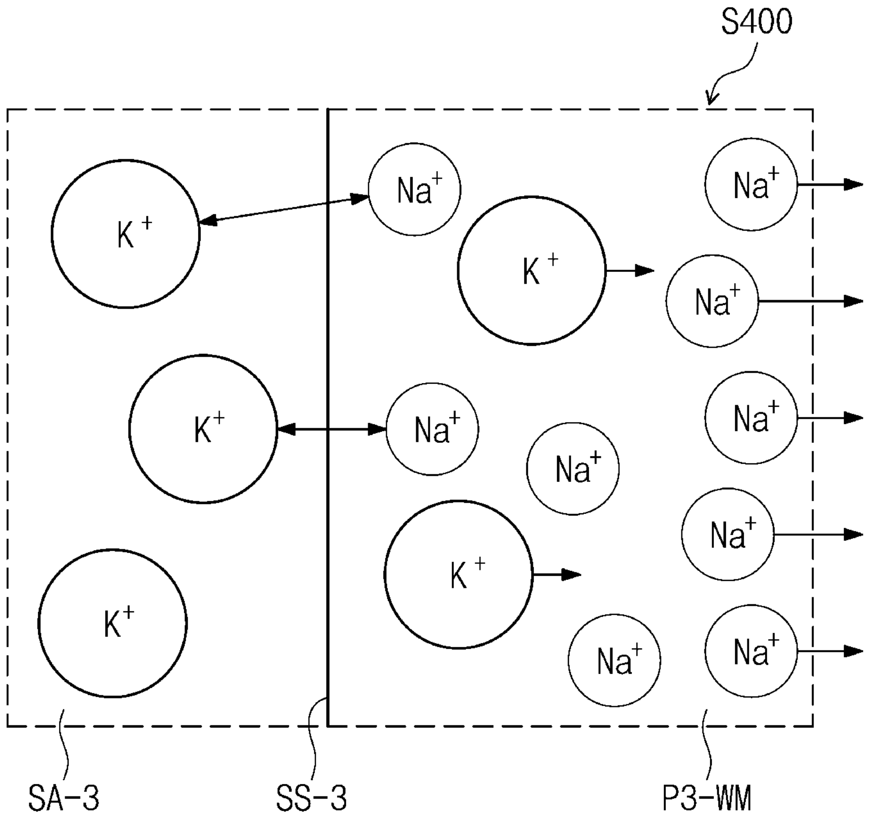
FIG. 7C is a schematic view illustrating a step of the window manufacturing method according to an embodiment of the disclosure.
Figure 8:
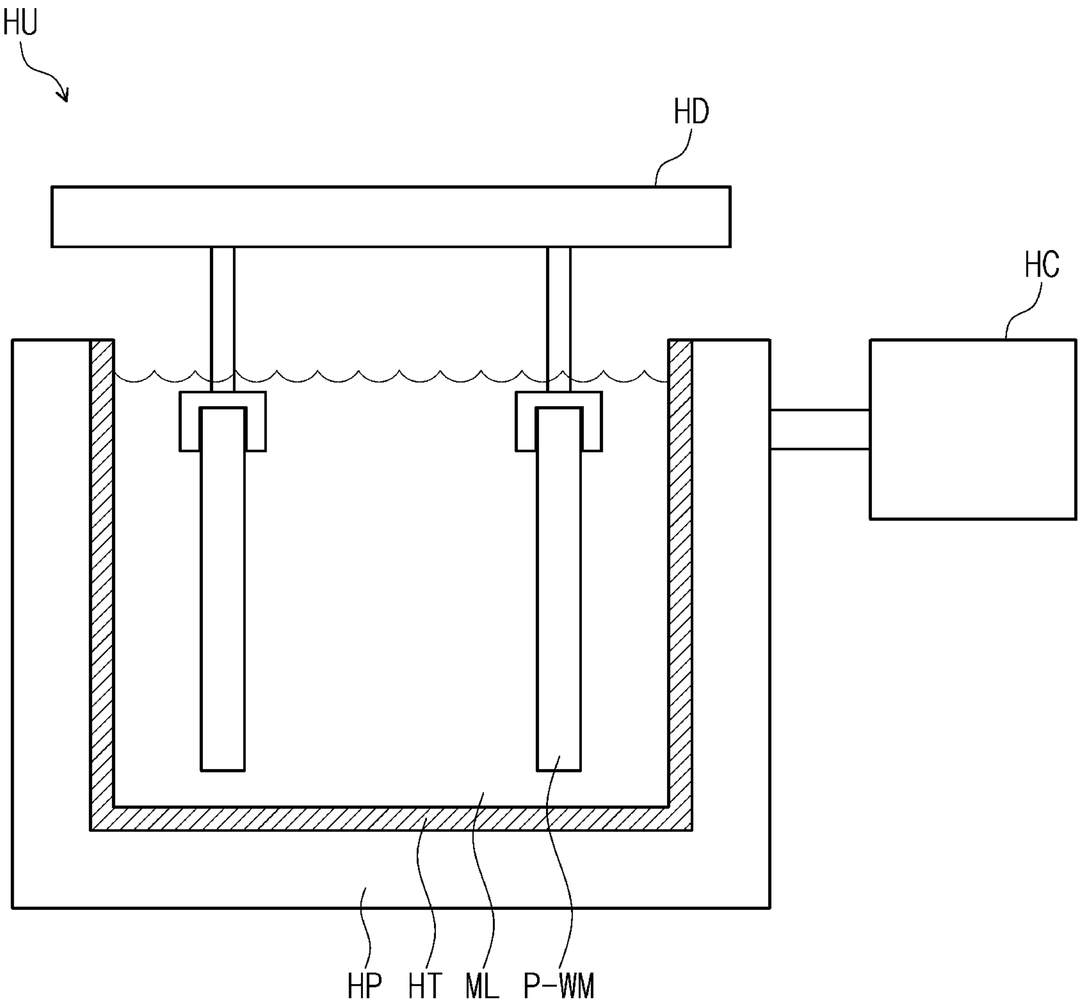
FIG. 8 is a schematic view illustrating a step of the window manufacturing method according to an embodiment of the disclosure.
Figure 9:
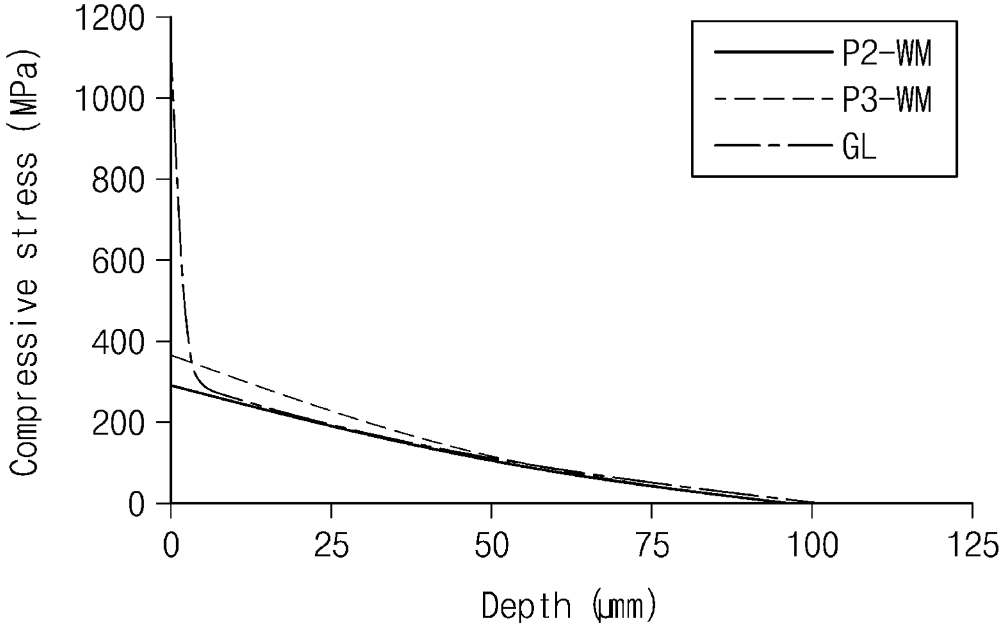
FIG. 9 is a graph depicting the compressive stress depending on the depth of the tempered glass substrate according to an embodiment of the disclosure.

FIG. 6 is a flowchart illustrating the window manufacturing method according to an embodiment of the disclosure. FIGS. 7A to 7C are schematic views illustrating steps of the window manufacturing method according to embodiments of the disclosure. FIG. 8 is a schematic view illustrating a step of the window manufacturing method according to an embodiment of the disclosure. FIG. 9 is a graph depicting the compressive stress depending on the depth of the tempered glass substrate GL (refer to FIG. 4) according to an embodiment of the disclosure.

The window WM (refer to FIG. 2) including the tempered glass substrate GL (refer to FIG. 4) according to the above-described embodiment may be formed by the window manufacturing method that will be described below. In describing the window manufacturing method with reference to FIGS. 6 to 9, repetitive descriptions identical or similar to ones given with reference to FIGS. 1 to 5 will be omitted, and the following description will be focused on differences.

The window manufacturing method may include a step S100 of preparing a first preliminary glass substrate P1-WM, a step S200 of forming a second preliminary glass substrate P2-WM from the first preliminary glass substrate P1-WM, a step S300 of forming a third preliminary glass substrate P3-WM from the second preliminary glass substrate P2-WM, and a step S400 of forming the tempered glass substrate GL (refer to FIG. 4) from the third preliminary glass substrate P3-WM.

The window manufacturing method may further include a cleaning step and/or a cooling step between the step S200 of forming the second preliminary glass substrate P2-WM and the step S300 of forming the third preliminary glass substrate P3-WM, between the step S300 of forming the third preliminary glass substrate P3-WM and the step S400 of forming the tempered glass substrate GL (refer to FIG. 4), and after the step S400 of forming the tempered glass substrate GL (refer to FIG. 4).

The window manufacturing method may include the step S100 of preparing the first preliminary glass substrate P1-WM.

The first preliminary glass substrate P1-WM may be glass including an alumino-silicate skeleton formed from $Al_2O_3$ and $SiO_2$. The first preliminary glass substrate P1-WM may be glass containing $Li^+$ ions. The first preliminary glass substrate P1-WM may be lithium alumino-silicate (LAS) glass containing Li+ ions in an alumino-silicate skeleton. As another example, the first preliminary glass substrate P1-WM may be ceramic glass containing $Li^+$ ions. The first preliminary glass substrate P1-WM may additionally contain $Na^+$ ions.

The window manufacturing method may include the step S200 of forming the second preliminary glass substrate P2-WM.

The second preliminary glass substrate P2-WM may be formed by providing a first strengthening molten salt SA-1 to the first preliminary glass substrate P1-WM. The first strengthening molten salt SA-1 may be provided at a temperature of about 360° C. to about 440° C. for about 90 minutes to about 150 minutes.

The first strengthening molten salt SA-1 may contain $Na^+$ ions. For example, the first strengthening molten salt SA-1 may contain $NaNO_3$. The first strengthening molten salt SA-1 may contain only the $Na^+$ ions as positive ions and may not contain other positive ions. The first strengthening molten salt SA-1 may contain substantially about 100 wt % of $NaNO_3$ based on the total weight of the first strengthening molten salt SA-1.

FIG. 7A illustrates the step S200 of forming the second preliminary glass substrate P2-WM (refer to FIG. 7B) by providing the first strengthening molten salt SA-1 to the first preliminary glass substrate P1-WM. Specifically, movement between the ions of the first strengthening molten salt SA-1 and the ions of the first preliminary glass substrate P1-WM is schematically illustrated.

Referring to FIG. 7A, on a surface SS-1 of the first preliminary glass substrate P1-WM, the $Na^+$ ions of the first strengthening molten salt SA-1 may be exchanged with the $Li^+$ ions contained in the first preliminary glass substrate P1-WM. For example, the $Li^+$ ions that are contained in the first preliminary glass substrate P1-WM and that have a small ionic radius may be exchanged with the $Na^+$ ions having a relatively large ionic radius. The surface SS-1 of the first preliminary glass substrate P1-WM may be an upper surface and/or a lower surface of the first preliminary glass substrate P1-WM. The surface SS-1 of the first preliminary glass substrate P1-WM may be an outer surface of the first preliminary glass substrate P1-WM exposed to the outside.

The $Na^+$ ions of the first strengthening molten salt SA-1 may be diffused and moved into the first preliminary glass substrate P1-WM. The $Na^+$ ions contained in the first strengthening molten salt SA-1 may be provided to form the compressive stress layer CSL (refer to FIG. 4) having a deep thickness. In case that the first strengthening molten salt SA-1 contains the $Na^+$ ions, the compressive stress layer CSL (refer to FIG. 4) having a thickness (e.g., a deep or great thickness) may be formed. For example, when compared to the first strengthening molten salt SA-1 additionally containing $K^+$ ions having a large ionic radius, the first strengthening molten salt SA-1 containing only the $Na^+$ ions having a small ionic radius may have an advantage in forming the compressive stress layer CSL (refer to FIG. 4) having a deep thickness.

Even after the step S200 of forming the second preliminary glass substrate P2-WM, the $Na^+$ ions moved from the first strengthening molten salt SA-1 to the first preliminary glass substrate P1-WM may move into the glass substrate in subsequent processes that are sequentially performed and may form the thicker compressive stress layer CSL (FIG. 4). For example, the $Na^+$ ions moved from the first strengthening molten salt SA-1 to the first preliminary glass substrate P1-WM may be further diffused and moved toward the inside of the second preliminary glass substrate P2-WM in the step S300 of forming the third preliminary glass substrate P3-WM.

The second preliminary glass substrate P2-WM may be formed by exchanging the $Li^+$ ions of the first preliminary glass substrate P1-WM with the $Na^+$ ions. In FIG. 9, compressive stress depending on the depth of the second preliminary glass substrate P2-WM formed from the first preliminary glass substrate P1-WM is illustrated. A compressive stress on a surface SS-2 of the second preliminary glass substrate P2-WM in which the $Li^+$ ions are exchanged with the $Na^+$ ions to increase the $Na^+$ ion concentration may be greater than a compressive stress on the surface SS-1 of the first preliminary glass substrate P1-WM. The $Na^+$ ions may move into the second preliminary glass substrate P2-WM, and thus a compressive stress at a specific depth of the second preliminary glass substrate P2-WM may be greater than a compressive stress at a specific depth of the first preliminary glass substrate P1-WM.

The window manufacturing method may include the step S300 of forming the third preliminary glass substrate P3-WM.

The third preliminary glass substrate P3-WM may be formed by providing a second strengthening molten salt SA-2 to the second preliminary glass substrate P2-WM. The second strengthening molten salt SA-2 may be provided at a temperature of about 360° C. to about 440° C. for about 30 minutes to about 90 minutes.

The second strengthening molten salt SA-2 may contain $Na^+$ ions and $K^+$ ions. For example, the second strengthening molten salt SA-2 may contain $NaNO_3$ and $KNO_3$. The second strengthening molten salt SA-2 may contain the $Na^+$ ions and $K^+$ ions as positive ions and may not contain other positive ions. The second strengthening molten salt SA-2 may contain about 30 wt % to about 70 wt % of $NaNO_3$ and about 30 wt % to about 70 wt % of $KNO_3$ based on the total weight of the second strengthening molten salt SA-2.

FIG. 7B illustrates the step S300 of forming the third preliminary glass substrate P3-WM (refer to FIG. 3) by providing the second strengthening molten salt SA-2 to the second preliminary glass substrate P2-WM. Specifically, movement between the ions of the second strengthening molten salt SA-2 and the ions of the second preliminary glass substrate P2-WM is schematically illustrated.

Referring to FIG. 7B, on the surface SS-2 of the second preliminary glass substrate P2-WM, the $Na^+$ ions and the $K^+$ ions of the second strengthening molten salt SA-2 may be exchanged with the $Li^+$ ions and the $Na^+$ ions contained in the second preliminary glass substrate P2-WM. For example, the $Li^+$ ions that are contained in the second preliminary glass substrate P2-WM and that have a small ionic radius may be exchanged with the $Na^+$ ions having a relatively large ionic radius. The Nat ions that are contained in the second preliminary glass substrate P2-WM and that have a relatively small ionic radius may be exchanged with the $K^+$ ions having a relatively large ionic radius. Although not illustrated in FIG. 7B, the $K^+$ ions of the second strengthening molten salt SA-2 may be exchanged with the $Li^+$ ions contained in the second preliminary glass substrate P2-WM. The surface SS-2 of the second preliminary glass substrate P2-WM may be an upper surface and/or a lower surface of the second preliminary glass substrate P2-WM. Furthermore, the surface SS-2 of the second preliminary glass substrate P2-WM may be an outer surface of the second preliminary glass substrate P2-WM exposed to the outside.

The $Na^+$ ions of the second strengthening molten salt SA-2 may be diffused and moved into the second preliminary glass substrate P2-WM. The $Na^+$ ions contained in the second strengthening molten salt SA-2 may be provided to form the compressive stress layer CSL (refer to FIG. 4) having a deeper thickness. Specifically, the $Na^+$ ions moved from the first strengthening molten salt SA-1 to the first preliminary glass substrate P1-WM in the above-described step S200 of forming the second preliminary glass substrate P2-WM may be further diffused and moved toward the inside of the second preliminary glass substrate P2-WM in the step S300 of forming the third preliminary glass substrate P3-WM. In case that the second strengthening molten salt SA-2 contains the $Na^+$ ions, the compressive stress layer CSL (refer to FIG. 4) having a deeper thickness may be formed. For example, when compared to the second strengthening molten salt SA-2 containing only the $K^+$ ions, the second strengthening molten salt SA-2 containing the $Na^+$ ions and the $K^+$ ions may have an advantage in forming the compressive stress layer CSL (refer to FIG. 4) having a deeper thickness.

The $K^+$ ions of the second strengthening molten salt SA-2 may be diffused and moved into the second preliminary glass substrate P2-WM. The $K^+$ ions that are contained in the second strengthening molten salt SA-2 and that have a large ionic radius may be provided to improve the compressive stress of the compressive stress layer CSL (refer to FIG. 4). In case that the second strengthening molten salt SA-2 contains the $K^+$ ions, the compressive stress of the compressive stress layer CSL (refer to FIG. 4) may be further improved. Specifically, not only a compressive stress on a surface corresponding to the first region A10 (refer to FIG. 4) of the tempered glass substrate GL (refer to FIG. 4) but also a compressive stress of the inside corresponding to the second region A20 (refer to FIG. 4) may be further improved. For example, when compared to the second strengthening molten salt SA-2 containing only the $Na^+$ ions, the second strengthening molten salt SA-2 containing the $Na^+$ ions and the $K^+$ ions may have an advantage in forming further an improved compressive stress.

The third preliminary glass substrate P3-WM may be formed by exchanging the $Li^+$ ions and the $Na^+$ ions of the second preliminary glass substrate P2-WM with the Nations and the $K^+$ ions. In FIG. 9, compressive stress depending on the depth of the third preliminary glass substrate P3-WM formed from the second preliminary glass substrate P2-WM is illustrated. A compressive stress on a surface SS-3 of the third preliminary glass substrate P3-WM in which the $Li^+$ ions and the Nations are exchanged with the $Na^+$ ions and the $K^+$ ions to increase the $Na^+$ ion concentration and the $K^+$ ion concentration may be greater than the compressive stress on the surface SS-2 of the second preliminary glass substrate P2-WM. The $Na^+$ ions may move into the third preliminary glass substrate P3-WM, and thus a compressive stress at a specific depth of the third preliminary glass substrate P3-WM may be greater than a compressive stress at a specific depth of the second preliminary glass substrate P2-WM.

Specifically, the thickness of the compressive stress layer of the third preliminary glass substrate P3-WM may be in a range of about 90 μm to about 120 μm. Based on the thickness direction of the third preliminary glass substrate P3-WM, a compressive stress at a depth of about 30 μm from the surface SS-3 of the third preliminary glass substrate P3-WM may be in a range of about 180 MPa to about 300 MPa, and a compressive stress at a depth of about 50 μm from the surface SS-3 of the third preliminary glass substrate P3-WM may be in a range of about 100 MPa to about 200 MPa. The slope of the compressive stress depending on the depth based on the thickness direction of the third preliminary glass substrate P3-WM may be greater than about-10 MPa/μm and less than about 0 MPa/μm.

As the compressive stress of the third preliminary glass substrate P3-WM has the above-described range, the tempered glass substrate GL (refer to FIG. 4) formed from the third preliminary glass substrate P3-WM may form the thick compressive stress layer CSL and may exhibit an improved compressive stress inside the tempered glass substrate GL (refer to FIG. 4).

The window manufacturing method may include the step S400 of forming the tempered glass substrate GL (refer to FIG. 4).

The tempered glass substrate GL (refer to FIG. 4) may be formed by providing a third strengthening molten salt SA-3 to the third preliminary glass substrate P3-WM. The third strengthening molten salt SA-3 may be provided at a temperature of about 380° C. to about 440° C. for about 10 minutes to about 40 minutes.

The third strengthening molten salt SA-3 may contain $K^+$ ions. For example, the third strengthening molten salt SA-3 may contain $KNO_3$. The third strengthening molten salt SA-3 may contain only the $K^+$ ions as positive ions and may not contain other positive ions. The third strengthening molten salt SA-3 may contain substantially about 100 wt % of $KNO_3$ based on the total weight of the third strengthening molten salt SA-3.

FIG. 7C illustrates the step S400 of forming the tempered glass substrate GL (refer to FIG. 4) by providing the third strengthening molten salt SA-3 to the third preliminary glass substrate P3-WM. Specifically, movement between the ions of the third strengthening molten salt SA-3 and the ions of the third preliminary glass substrate P3-WM is schematically illustrated.

Referring to FIG. 7C, on the surface SS-3 of the third preliminary glass substrate P3-WM, the $K^+$ ions of the third strengthening molten salt SA-3 may be exchanged with the $Na^+$ ions contained in the third preliminary glass substrate P3-WM. For example, the $Na^+$ ions that are contained in the third preliminary glass substrate P3-WM and that have a relatively small ionic radius may be exchanged with the $K^+$ ions having a relatively large ionic radius. Although not illustrated in FIG. 7C, the $K^+$ ions of the third strengthening molten salt SA-3 may be exchanged with the $Li^+$ ions contained in the third preliminary glass substrate P3-WM. The surface SS-3 of the third preliminary glass substrate P3-WM may be an upper surface and/or a lower surface of the third preliminary glass substrate P3-WM. Furthermore, the surface SS-3 of the third preliminary glass substrate P3-WM may be an outer surface of the third preliminary glass substrate P3-WM exposed to the outside.

The $K^+$ ions of the third strengthening molten salt SA-3 may be diffused and moved into the third preliminary glass substrate P3-WM. The $K^+$ ions contained in the third strengthening molten salt SA-3 may be provided to improve a compressive stress on the surface of the third preliminary glass substrate P3-WM. When the third strengthening molten salt SA-3 contains the $K^+$ ions, the compressive stress on the surface may be greatly increased.

The tempered glass substrate GL (refer to FIG. 4) may be formed by exchanging the $Li^+$ ions and/or the $Na^+$ ions of the third preliminary glass substrate P3-WM with the $K^+$ ions. In FIG. 9, the compressive stress depending on the depth of the tempered glass substrate GL formed from the third preliminary glass substrate P3-WM is illustrated. A compressive stress on a surface of the tempered glass substrate GL in which the $Li^+$ ions and/or the Nations are exchanged with the $K^+$ ions to increase the $K^+$ ion concentration may be greater than a compressive stress on the surface SS-3 of the third preliminary glass substrate P3-WM.

Referring to FIGS. 7A to 7C, the $Na^+$ ions provided through the first strengthening molten salt SA-1 and the second strengthening molten salt SA-2 may not only be located on the surface of the glass substrate, but may also move into the glass substrate in the steps of providing the strengthening molten salts to improve a compressive stress inside the glass substrate. For example, in the completed tempered glass substrate GL (refer to FIG. 4), some of the $Na^+$ ions provided through the first strengthening molten salt SA-1 and the second strengthening molten salt SA-2 may move to the innermost portion of the compressive stress layer CSL, e.g., the position in contact with the base layer BS (refer to FIG. 4).

The $K^+$ ions provided through the second strengthening molten salt SA-2 and the third strengthening molten salt SA-3 may not only be located on the surface of the glass substrate, but may also partially move into the glass substrate in the steps of providing the strengthening molten salts to improve a compressive stress inside the glass substrate. For example, in the completed tempered glass substrate GL (refer to FIG. 4), some of the $K^+$ ions provided through the second strengthening molten salt SA-2 and the third strengthening molten salt SA-3 may move to a portion of the compressive stress layer CSL located inward of the first region A10.

The $K^+$ ions provided through the third strengthening molten salt SA-3 may greatly improve a compressive stress on the surface of the glass substrate. In the completed tempered glass substrate GL (refer to FIG. 4), the $K^+$ ions provided through the third strengthening molten salt SA-3 may be located in the first region A10 and may greatly improve the compressive stress of the first region A10.

As the window manufacturing method provides the strengthening molten salts in the three steps as described above, the three ion exchange steps are performed. The tempered glass substrate GL (refer to FIG. 4) manufactured through the window manufacturing method may include the compressive stress layer CSL (refer to FIG. 4) having the thickness TH-C of about 100 μm to about 130 μm (refer to FIG. 4), and not only a compressive stress on the surface of the tempered glass substrate GL but also a compressive stress inside the tempered glass substrate GL may be improved.

Accordingly, the window WM (refer to FIG. 2) including the tempered glass substrate GL (refer to FIG. 4) formed through the above-described window manufacturing method may exhibit improved strength. The display device DD (refer to FIG. 2) including the window WM (refer to FIG. 2) formed through the above-described window manufacturing method may include regions having different compressive stress change rates (e.g., the first region A10, the second region A20, and the inflection region A30) and may exhibit excellent reliability against external impact.

The window manufacturing method may further include a step of forming the printed layer BZ (refer to FIG. 3) on a surface of the tempered glass substrate GL (refer to FIG. 3). As described above, the printed layer BZ (refer to FIG. 3) may be formed on the lower surface RS of the tempered glass substrate GL (refer to FIG. 3) through a printing or deposition process.

FIG. 8 is a schematic view illustrating an ion exchange apparatus that performs the ion exchange included in the step S200 (refer to FIG. 6) of forming the second preliminary glass substrate P2-WM (refer to FIG. 7B) from the first preliminary glass substrate P1-WM (refer to FIG. 7A), the ion exchange included in the step S300 (refer to FIG. 6) of forming the third preliminary glass substrate P3-WM (refer to FIG. 7C) from the second preliminary glass substrate P2-WM (refer to FIG. 7B), and the ion exchange included in the step S400 (refer to FIG. 6) of forming the tempered glass substrate GL (refer to FIG. 4) from the third preliminary glass substrate P3-WM (refer to FIG. 7C). A preliminary glass substrate P-WM of FIG. 8 may be the first preliminary glass substrate P1-WM (refer to FIG. 7A), the second preliminary glass substrate P2-WM (refer to FIG. 7B), or the third preliminary glass substrate P3-WM (refer to FIG. 7C).

A strengthening part HU may be used to provide the first strengthening molten salt SA-1, the second strengthening molten salt SA-2, and the third strengthening molten salt SA-3 to the preliminary glass substrate P-WM. The preliminary glass substrate P-WM may be immersed in a molten liquid ML by using the strengthening part HU. The molten liquid ML of FIG. 8 may be the first strengthening molten salt SA-1 (refer to FIG. 7A), the second strengthening molten salt SA-2 (refer to FIG. 7B), or the third strengthening molten salt SA-3 (refer to FIG. 7C).

The strengthening part HU may include a tank HT that holds the molten liquid ML, a heating part HP that is disposed to surround the tank HT and that applies heat to the molten liquid ML in the tank HT, an actuator HD that fixes and vertically moves the preliminary glass substrate P-WM to immerse the preliminary glass substrate P-WM in the molten liquid ML, and/or a controller HC that controls operation of the strengthening part HU. The controller HC may control the temperature of the molten liquid ML in the tank HT.

For example, the controller HC may control the heating part HP to heat the molten liquid ML to a certain temperature and maintain the temperature of the molten liquid ML at the temperature. The heating part HP may provide heat for heating the molten liquid ML, or may function as an insulator to maintain the temperature of the heated molten liquid ML. The entire preliminary glass substrate P-WM may be immersed in the molten liquid ML. In FIG. 8, two preliminary glass substrates P-WM are illustrated as being provided in the strengthening part HU. However, this is illustrative, and one or three or more preliminary glass substrates P-WM may be provided.

Figure 10A:
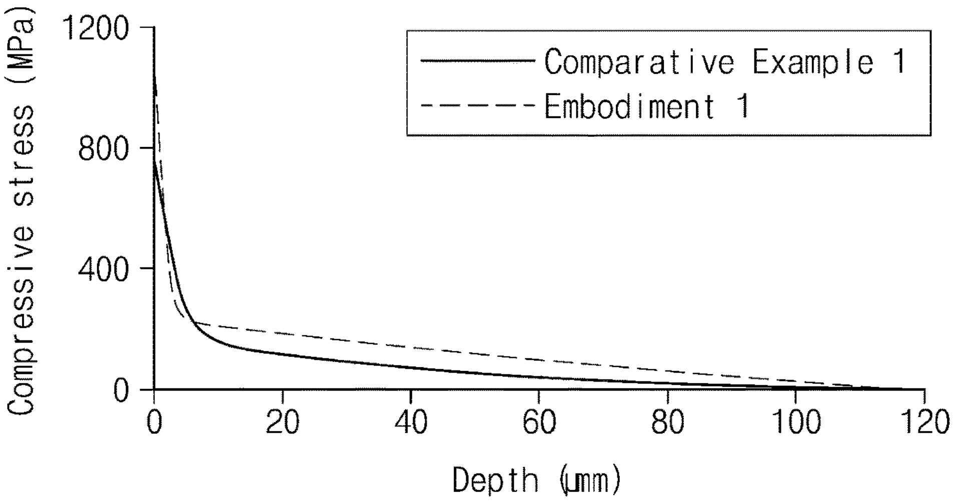
FIG. 10A is a graph depicting the compressive stresses depending on the depths of windows according to an embodiment of the disclosure and a comparative example.
Figure 10B:
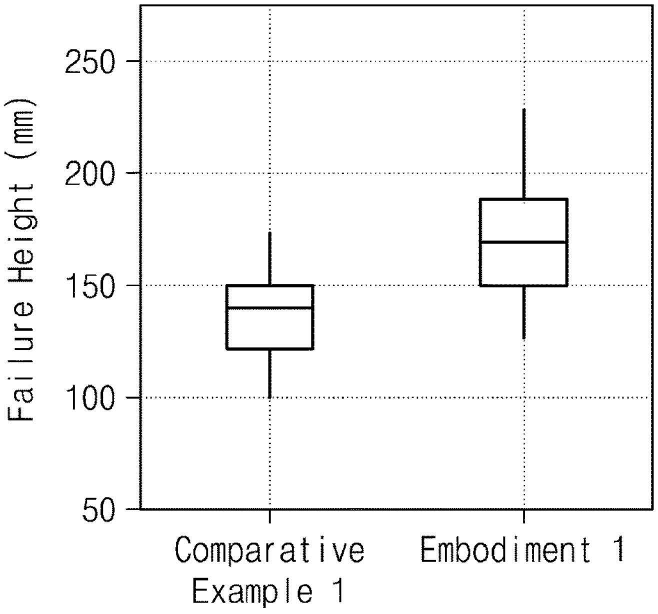
FIG. 10B is a graph depicting impact resistance evaluation results of the windows according to the embodiment of the disclosure and the comparative example.
Figure 11A:
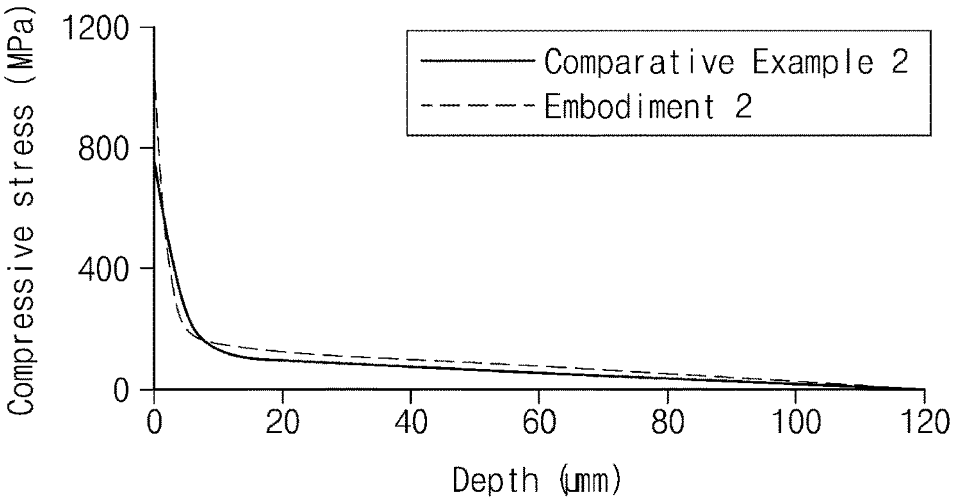
FIG. 11A is a graph depicting the compressive stresses depending on the depths of windows according to an embodiment of the disclosure and a comparative example.
Figure 11B:
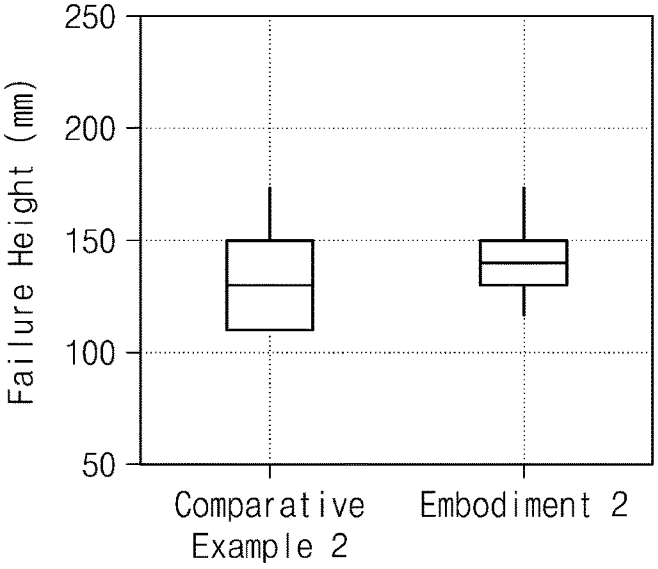
FIG. 11B is a graph depicting impact resistance evaluation results of the windows according to the embodiment of the disclosure and the comparative example.

FIG. 10A is a graph depicting the compressive stresses depending on the depths of windows according to an embodiment of the disclosure and a comparative example. FIG. 10B is a graph depicting impact resistance evaluation results of the windows according to the embodiment of the disclosure and the comparative example. FIG. 11A is a graph depicting the compressive stresses depending on the depths of windows according to an embodiment of the disclosure and a comparative example. FIG. 11B is a graph depicting impact resistance evaluation results of the windows according to the embodiment of the disclosure and a comparative example.

FIG. 10A illustrates the compressive stress after a glass material A is subjected to chemical strengthening. Specifically, in embodiment 1 of FIG. 10A, a tempered glass substrate is formed by providing the first to third strengthening molten salts to the glass material A through three steps according to the manufacturing method of the disclosure. In contrast, in comparative example 1 of FIG. 10A, a tempered glass substrate is formed by providing the second and third strengthening molten salts to the glass material A through two steps without the step of providing the first strengthening molten salt in the manufacturing method of the disclosure. The glass material A contains 63.89 wt % of $SiO_2$, 18.22 wt % of $Al_2O_3$, 2.04 wt % of MgO, 0.74 wt % of CaO, 0.18 wt % of $SnO_2$, 4.31 wt % of $ZrO_2$, 4.30 wt % of $Na_2O$, 2.04 wt % of $K_2O$, 4.04 wt % of $Li_2O_3$, 0.01 wt % of $Fe_2O_3$, 0.17 wt % of $TiO_2$, 0.01 wt % of $P_2O_5$, and 0.05 wt % of $Y_2O_3$. The compressive stresses depending on the depths of the windows in embodiment 1 and comparative example 1 are measured in ASTM standard C770-16 using FSM-6000LE and SLP2000 of Orihara Industrial Co. Ltd.

Referring to FIG. 10A, the compressive stress on the surface of the tempered glass substrate of embodiment 1 is improved when compared to the compressive stress on the surface of the tempered glass substrate of comparative example 1. When compared to the tempered glass substrate of comparative example 1, the tempered glass substrate of embodiment 1 has an effect that not only the compressive stress on the surface of the tempered glass substrate but also the compressive stress at a depth of 10 μm or more from the surface of the tempered glass substrate is improved.

FIG. 10B illustrates impact resistance evaluation results of the tempered glass substrates of embodiment 1 and comparative example 1 of FIG. 10A. The impact resistances are evaluated by the sandpaper ball drop test. In the sandpaper ball drop test, sandpaper (3M, #180) having a particle roughness of about 80 μm is placed on a granite plate, the tempered glass substrate is placed on the sandpaper, and a steel ball having 60 and 0.88 g is freely dropped. Thereafter, the failure height of the tempered glass substrate is measured.

Referring to FIG. 10B, the failure height of the tempered glass substrate of embodiment 1 is measured to be 172 mm, and the failure height of the tempered glass substrate of comparative example 1 is measured to be 137.667 mm.

FIG. 11A illustrates the compressive stress after a glass material B is subjected to chemical strengthening. Specifically, in embodiment 2 of FIG. 11A, a tempered glass substrate is formed by providing the first to third strengthening molten salts to the glass material B through three steps according to the manufacturing method of the disclosure. In contrast, in comparative example 2 of FIG. 11A, a tempered glass substrate is formed by providing the second and third strengthening molten salts to the glass material B through two steps without the step of providing the first strengthening molten salt in the manufacturing method of the disclosure. The glass material B contains 53.55 wt % of $SiO_2$, 27.54 wt % of $Al_2O_3$, 0.16 wt % of MgO, 0.55 wt % of CaO, 0.11 wt % of $SnO_2$, 0.03 wt % of $ZrO_2$, 5.56 wt % of $Na_2O$, 0.54 wt % of $K_2O$, 2.57 wt % of $Li_2O_3$, 0.01 wt % of $Fe_2O_3$, 0.02 wt % of $TiO_2$, and 9.37 wt % of $P_2O_5$. The compressive stresses depending on the depths of the windows in embodiment 2 and comparative example 2 are measured by the same method as that in embodiment 1 and comparative example 1.

Referring to FIG. 11A, the compressive stress on the surface of the tempered glass substrate of embodiment 2 is improved when compared to the compressive stress on the surface of the tempered glass substrate of comparative example 2. When compared to the tempered glass substrate of comparative example 2, the tempered glass substrate of embodiment 2 has an effect that not only the compressive stress on the surface of the tempered glass substrate but also the compressive stress at a depth of 10 μm or more from the surface of the tempered glass substrate is improved.

FIG. 11B illustrates impact resistance evaluation results of the tempered glass substrates of embodiment 2 and comparative example 2 of FIG. 11A. The impact resistances are measured by the same method as that in embodiment 1 and comparative example 1 described above.

Referring to FIG. 11B, the failure height of the tempered glass substrate of embodiment 2 is measured to be 144.667 mm, and the failure height of the tempered glass substrate of comparative example 2 is measured to be 131 mm.

The tempered glass substrate manufactured according to the disclosure may be formed by sequentially providing the first to third strengthening molten salts. Accordingly, the compressive stress on the surface of the tempered glass substrate may be improved, and the compressive stress inside the tempered glass substrate may also be improved. The deep compressive stress layer may be formed.

Thus, the window including the tempered glass substrate manufactured according to the disclosure may exhibit excellent impact resistance against external impact. The window may exhibit excellent strength by which the window is not damaged even when dropped from a high place. Accordingly, the display device including the window of the disclosure may exhibit excellent reliability and stability against external impact.

As described above, the window may have a high compressive stress and a deep strengthening depth and thus may exhibit improved strength.

Furthermore, the window manufacturing method may include the three chemical strengthening steps and thus may provide the window having improved strength.

The display device including the window may exhibit improved strength.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A window comprising:

a tempered glass substrate containing a Lit ion, a $Na^+$ ion, and a $K^+$ ion, the tempered glass substrate including:

a base layer; and a compressive stress layer disposed on at least one of an upper surface and a lower surface of the base layer, wherein the compressive stress layer includes:

a first region having a first compressive stress change rate; and a second region having a second compressive stress change rate smaller than the first compressive stress change rate, each of the first compressive stress change rate and the second compressive stress change rate is defined as a rate of change of compressive stress depending on a depth based on a thickness direction of the tempered glass substrate, the second region includes:

a first portion adjacent to the first region, the first portion including a first point;

a second portion adjacent to the base layer, the second portion including a second point; and a third portion disposed between the first portion and the second portion, the third portion including a third point, a compressive stress at the first point is in a range of about 100 MPa to about 250 MPa, a compressive stress at the second point is in a range of about 50 MPa to 150 about MPa, a compressive stress at the third point is in a range of about 70 MPa to about 200 MPa, and the compressive stresses are measured in ASTM standard C770-16, and wherein:

the first point is located at a depth of about 30 μm from a surface of the tempered glass substrate based on the thickness direction, the second point is located at a depth of about 70 μm from the surface of the tempered glass substrate based on the thickness direction, and the third point is located at a depth of about 50 μm from the surface of the tempered glass substrate based on the thickness direction.

2. The window of claim 1, wherein the compressive stress layer has a thickness in a range of about 100 μm to about 130 μm.

3. The window of claim 1, wherein a compressive stress on a surface of the tempered glass substrate is in a range of about 750 MPa to about 1300 MPa.

4. The window of claim 1, wherein a value obtained by integrating compressive stress depending on a depth of the compressive stress layer is in a range of about 10,000 $J/m^2$ to about 14,000 $J/m^2$.

5. The window of claim 1, wherein the first region is spaced apart from the base layer with the second region being disposed between the first region and the base layer.

6. The window of claim 1, wherein the tempered glass substrate has a thickness in a range of about 400 μm to about 800 μm.

7. A display device comprising:

a display module; and a window disposed on the display module, the window including a base layer and a compressive stress layer disposed on at least one of an upper surface and a lower surface of the base layer, wherein the compressive stress layer includes:

a first region having a first compressive stress change rate; and a second region having a second compressive stress change rate smaller than the first compressive stress change rate, each of the first compressive stress change rate and the second compressive stress change rate is defined as a rate of change of compressive stress depending on a depth based on a thickness direction of the window, the second region includes:

a first portion adjacent to the first region, the first portion including a first point;

a second portion adjacent to the base layer, the second portion including a second point; and a third portion disposed between the first portion and the second portion, the third portion including a third point, a compressive stress at the first point is in a range of about 100 MPa to about 250 MPa, a compressive stress at the second point is in a range of about 50 MPa to about 150 MPa, a compressive stress at the third point is in a range of about 70 MPa to about 200 MPa, and the compressive stresses are measured in ASTM standard C770-16, and wherein:

the first point is located at a depth of about 30 μm from a surface of the tempered glass substrate based on the thickness direction, the second point is located at a depth of about 70 μm from the surface of the tempered glass substrate based on the thickness direction, and the third point is located at a depth of about 50 μm from the surface of the tempered glass substrate based on the thickness direction.

8. The display device of claim 7, wherein a compressive stress on a surface of the window is in a range of about 750 MPa to about 1300 MPa, and a value obtained by integrating compressive stress depending on a depth of the compressive stress layer in a range of about 10,000 $J/m^2$ to about 14,000 $J/m^2$.

9. The display device of claim 7, wherein the window has a thickness in a range of about 400 μm to about 800 μm, and the compressive stress layer has a thickness in a range of about 100 μm to about 130 μm.

* * * * *